United States Patent [19]

Brighton

[11] Patent Number: 5,025,303

[45] Date of Patent: Jun. 18, 1991

[54] PRODUCT OF PILLAR ALIGNMENT AND FORMATION PROCESS

[75] Inventor: Jeffrey E. Brighton, Katy, Tex.

[73] Assignee: Texas Instruments Incorporated, Dallas, Tex.

[21] Appl. No.: 161,573

[22] Filed: Feb. 26, 1988

[51] Int. Cl.$^5$ .................................... H01L 23/48
[52] U.S. Cl. .................................... 357/68; 357/71
[58] Field of Search .................................... 357/68, 71

[56] References Cited

U.S. PATENT DOCUMENTS

| | | | |
|---|---|---|---|
| 4,799,093 | 1/1989 | Kohara et al. | 357/71 |
| 4,814,841 | 3/1989 | Masuoka et al. | 357/71 |
| 4,851,895 | 7/1989 | Green et al. | 357/71 |

Primary Examiner—Edward J. Wojciechowicz
Attorney, Agent, or Firm—B. Peter Barndt; Melvin Sharp; James T. Comfort

[57] ABSTRACT

A process for the formation of pillars (28) in connection with the fabrication of a semiconductor device (10) is disclosed. The process first aligns a lead pattern (30) with an existing structure (24) in the semiconductor device (10). Next, the process aligns a pillar pattern (32) with the lead pattern (30). These two patterns (30, 32) are then transferred downward into respective conductive layers (26, 28) of the semiconductor device (10). An insulating layer (34) is deposited over the conductive layers (26, 28) and etched-back to expose a portion of the pillar (28). A conductive layer (42) is applied over the exposed pillar (28).

3 Claims, 2 Drawing Sheets

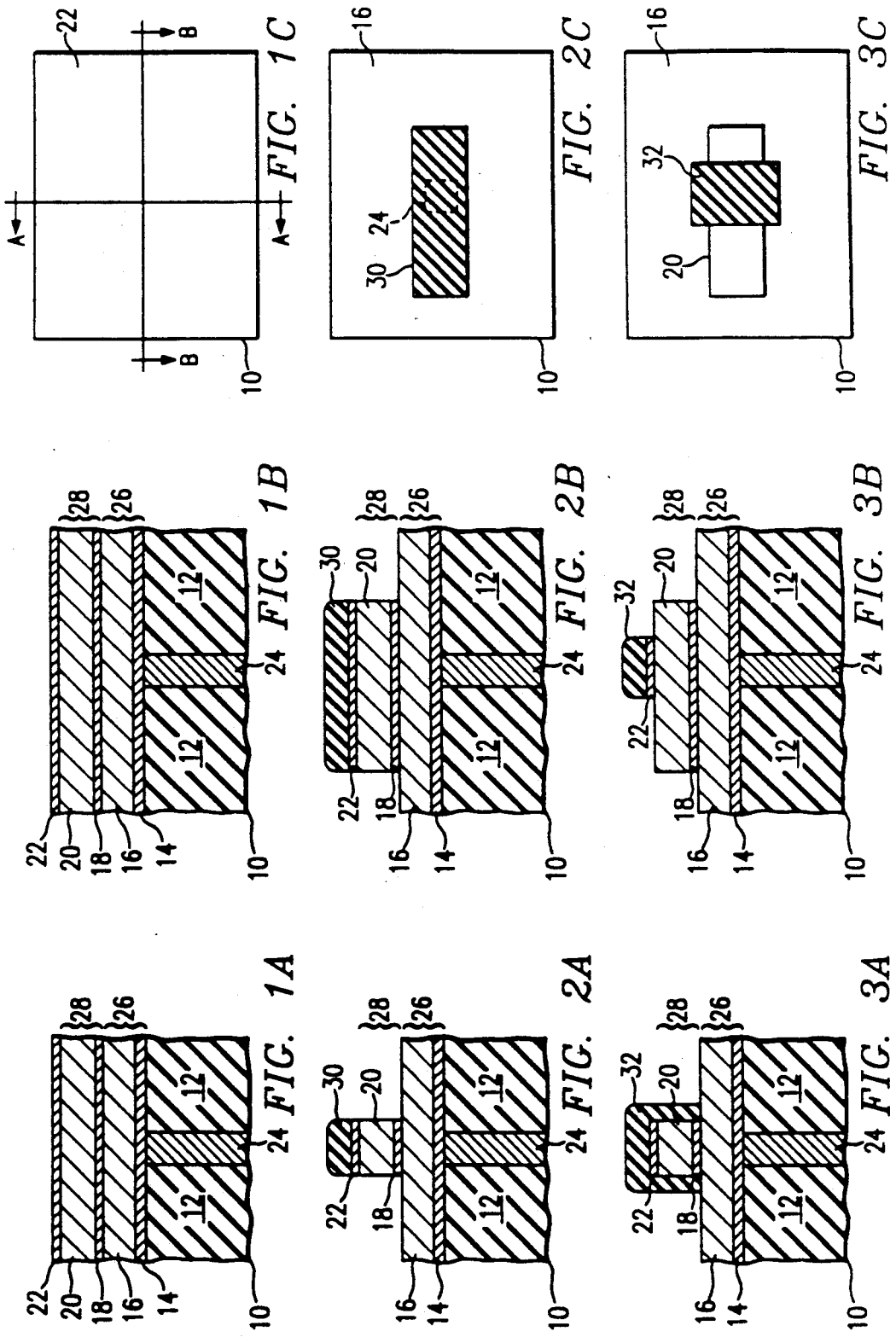

PRODUCT OF PILLAR ALIGNMENT AND FORMATION PROCESS

BACKGROUND OF THE INVENTION

In the fabrication of semiconductor devices, it is often necessary to make electrical interconnections at selected locations between two vertically separated metal layers. One technique for making such electrical interconnections is known as the "via" process. The via process simply etches a hole through an insulator which resides between the two separated layers. When the top one of the two metal layers is deposited, it contacts the bottom layer through the hole.

Alternatively, such electrical interconnections may be provided by the use of pillars. Pillars are conductive, vertically extending posts which are formed on the bottom of the two vertically separated layers and which extend to the top layer. Pillars may be formed by an additive process in which the pillars are added to the bottom conductive layer at desired locations. Alternatively, pillars may be formed by a subtractive process in which both a pillar and the bottom conductive layer are formed from a thick conductive sheet. This conductive sheet may contain a plurality of individual conductive layers.

One particular subtractive process for the formation of pillars is disclosed in U.S. Pat. application Ser. No. 123,754, filed Nov. 23, 1987, assigned to the assignee of the present invention, and incorporated herein by reference. In this process both a pillar and a pattern defined in the bottom one of the two vertically separated metal layers are individually aligned with a common feature, such as a contact. Consequently, the pillar and the pattern vertically align with one another. However, this alignment process causes a manufacturability problem.

Specifically, the first alignment step vertically aligns a pillar pattern with the common feature. Due to practical implications of semiconductor fabrication, the pillar pattern may not precisely align with the common feature but will reside within a predetermined lateral distance of the common feature. This distance represents a tolerance which is defined by photolithographic and other manufacturing limits. For example, if this tolerance is ±½ micron, as a worst case situation the pillar may be laterally skewed up to ½ micron away from the common feature.

The second alignment step aligns a lead pattern formed in the bottom conductive layer with the common feature. Again, the lead pattern may be laterally skewed away from vertical alignment with the common feature by a worst case distance established by the manufacturing tolerance. When these two alignment steps combine the manufacturing tolerance doubles. For example, a pillar pattern may be laterally skewed away from the common feature to the right by ½ micron, while the lead pattern is laterally skewed away from the common feature to the left by ½ micron. With the ½ micron tolerances, the pillar and the lead pattern may be skewed one micron away from each other.

One solution to the doubled tolerance problem is to dimension the pillars and leads to compensate for this worst case double-skewing effect. For the above example, this compensation is equivalent to utilizing ±1 micron layout rules even though a fabrication processes otherwise successfully produces semiconductor devices using ±½ micron layout rules. However, such a solution undesirably decreases the density of the semiconductor device being fabricated.

Accordingly, a need exits for a process that forms pillars without subjecting the layout to the above-mentioned doubled tolerance effect.

SUMMARY OF THE INVENTION

Accordingly, it is an advantage of the present invention that an improved subtractive process for the formation of pillars is provided.

Another advantage of the present invention is that an improved pillar formation process is provided so that only one alignment occurs with an existing semiconductor feature.

The above and other advantages of the present invention are carried out in one form by a process of interconnecting metal layers through an intermediate insulating layer. The process starts with a substrate that has an aligning structure thereon. Next, the process forms first and pillar layers of electrically conducting materials on the substrate. A first layer pattern is then formed in the first layer and a pillar pattern is formed in the pillar layer. The first layer pattern is aligned with the aligning structure, and the pillar pattern is aligned with the first layer pattern. Next, an insulating layer is deposited over the first and pillar layers, and portions of the insulating layer are removed to expose a small portion of the pillar layer.

Finally, a second layer of conducting material is deposited over the insulating and pillar layers. The second layer of conducting material forms a second layer pattern which is defined so that the pillar layer connects the first and second layers together.

BRIEF DESCRIPTION OF THE DRAWINGS

A more complete understanding of the present invention may be derived by referring to the detailed description and claims when considered in connection with the FIGUREs, wherein like reference numbers refer to similar items, and:

FIGS. 1A-1C show schematic cross-sectional views of a portion of a semiconductor device at an initial stage in the fabrication of a pillar in accordance with the present invention;

FIGS. 2A-2C show schematic cross-sectional views of the pillar after a first intermediate stage in the process of the present invention;

FIGS. 3A-3C show schematic cross-sectional views of the pillar after a second intermediate stage in the process of the present invention;

DETAILED DESCRIPTION OF THE PREFERRED EMBODIMENT

Figure 4A:
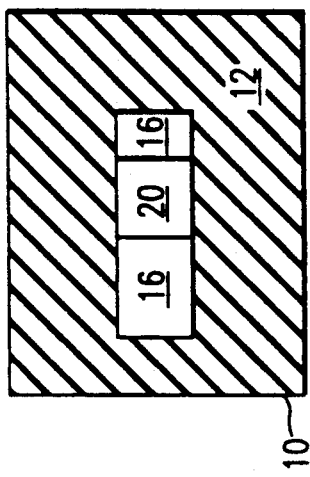
FIGS. 4A-4C show schematic cross-sectional views of the pillar after a third intermediate stage in the process of the present invention.

FIGS. 1A-7 show a semiconductor device 10 at various stages in the fabrication of a conductive pillar which interconnects metal layers in device 10. FIG- URES 1A-7 illustrate only a single pillar rather than an entire semiconductor device. Those skilled in the art will recognize that an entire semiconductor device may contain many such pillars which are constructed substantially as described herein. FIGS. 1A-4A depict this single pillar portion of device 10 in a cross-sectional side view which is defined by line A—A of FIG. 1C. Likewise, FIGURES 1B-4B depict a cross-sectional side view defined by line B—B of FIG. 1C, and FIGS. 1C-4C show a plan view of this single pillar portion of device 10. All of FIGS. 1A-7 illustrate a common point in device 10. Consequently, each of the cross-sectional views shown in FIGS. 1A-7 shows a plane which is perpendicular to the planes depicted by the other cross-sectional views presented in FIG. 1A-7.

FIGS. 1A-1C illustrate an initial stage in the fabrication of the present invention. In FIGS. 1A-1C, device 10 includes an insulating layer 12. Insulating layer 12 may overlie any one of a wide variety of semiconductor features (not shown) on device 10. A relatively thin barrier layer 14 overlies layer 12, a relatively thick metal layer 16 overlies barrier layer 14, a relatively thin barrier layer 18 overlies layer 16, a relatively thick metal layer 20 overlies layer 18, and a relative thin barrier layer 22 overlies layer 20. In the preferred embodiment, each of barrier layers 14, 18, and 22 are comprised of the same material. This material is chosen so that it may act as an etch stop for later-occurring stages in the fabrication of device 10. Moreover, this material is selected so that it effectively stops the migration of impurities from metal layers 16 and 18 downward through insulating layer 12 to other semiconductor features of device 10. Thus, in the preferred embodiment each of layers 14, 18 and 22 is a Ti:W layer which is deposited using conventional techniques to a thickness of approximately 2,300 angstroms.

Metal layers 16 and 18 represent conducting materials which are conventionally utilized in the fabrication of semiconductor devices. The preferred embodiment utilizes a copper doped aluminum material for layers 16 and 18. Moreover, in the preferred embodiment layers 16 and 18 are deposited to a thickness of around 0.5 to 1.0 microns. In the present invention, barrier layer 14 and metal layer 16 together form a lower conductive layer 26. In addition, barrier layer 18 together with metal layer 20 form a conductive pillar layer 28.

Device 10 includes a contact 24. Contact 24 may represent a hole through insulating layer 12 in device 10 which has been filled with a refractory metal, such as tungsten. As shown in the FIGURES, this refractory metal is planarized back to the surface of insulating layer 12 prior to deposition of layers 14-22. Alternatively, contact 24 may consist of a conventional sloped contact (not shown). One end of contact 24 (not shown) may contact a semiconductor material so that electrical connection is made between the semiconductor material and overlying metal layers. The other end of contact 24 exits insulating layer 12 at the boundary between insulating layer 12 and barrier layer 14.

Contact 24 represents an aligning structure upon which a pattern formed in lower conducting layer 26 is referenced. However, for the purposes of the present invention, this aligning structure need not be a contact but could be any feature previously formed in device 10 with which an overlying metal layer is aligned.

FIGS. 2A-2C illustrate a stage in the fabrication of the present invention which results after performing various processing steps upon the structure shown in FIGS. 1A-1C. Moreover, FIGS. 2A, 2B, and 2C depict the same cross-sectional views as are depicted in FIGURES 1A, 1B, and 1C, respectively. First, a lead pattern has been defined by applying a positive photoresist 30 overlying portions of barrier layer 22. The lead pattern is vertically aligned with contact 24. In other words, when the lead pattern is transferred vertically downward in a later-occurring process step, the lead pattern will directly overlie contact 24. In addition, photoresist 30 is dimensioned sufficiently large in both width (see FIG. 2A) and length (see FIG. 2B) so that worst case lateral skewing of photoresist 30 within manufacturing tolerances does not cause any portion of contact 24 to become vertically unaligned with the lead pattern defined by photoresist 30.

Next, an etching step removes portions of barrier layer 22 in accordance with the lead pattern definition provided by photoresist 30. The preferred embodiment utilizes reactive ion etching so that substantially straight, vertical walls are formed in barrier layer 22. The reactive ion etching process utilizes a dry fluorine chemistry. The dry fluorine chemistry etches Ti:W at a much faster rate than it etches the copper-doped aluminum from which layer 20 is comprised. Consequently, layer 20 serves as an etch stop for the etching of layer 22.

After the etching of layer 22, another etch step transfers the lead pattern downward into metal layer 20. The preferred embodiment uses reactive ion etching so that a substantially straight, vertical wall results. This etch step utilizes a dry chlorine chemistry so that barrier layer 18 acts as an etch stop.

Next, a subsequent etching step utilizes reactive ion etching to transfer the lead pattern downward into layer 18. This etching step utilizes dry fluorine chemistry so that metal layer 16 serves as an etch stop. Consequently, as a result of the above-described three etching steps, the lead pattern defined by photoresist 30 has been transferred downward into pillar layer 28. Moreover, at the present stage of fabrication, only photoresist 30 and metal layer 16 are exposed to the vertical direction (see FIG. 2C).

FIGS. 3A-3C illustrate device 10 after the performance of subsequent processing steps. FIGS. 3A, 3B, and 3C illustrate the same sectional views as are illustrated in FIGS. 2A, 2B, and 2C, respectively. Thus, photoresist 30 (see FIGS. 2A-2C) has been stripped from device 10, and a second photoresist 32 has been applied. Photoresist 32 is aligned vertically with the lead pattern which was previously transferred into pillar layer 28, as discussed above. Thus, any alignment of photoresist 32 with contact 24 is unimportant and purely coincidental. Moreover, as shown in FIGS. 3A and 3C, photoresist 32 overlaps the width of metal layer 20. The extent of this overlap allows lateral skewing of photoresist 32 relative to the lead pattern formed in metal layer 20 within manufacturing tolerances so that portions of photoresist 32 are guaranteed to cover the entire width of metal layer 20. Only one manufacturing tolerance need be accounted for in this overlap.

After the application of photoresist 32, an etching step removes exposed portions of barrier layer 22 so that the structure shown in FIGS. 3A-3C results. The preferred embodiment again uses reactive ion etching with a dry fluorine chemistry so that vertical walls are formed in barrier layer 22 and so that metal layer 20 acts as an etch stop. As a result of this etching operation, a pillar pattern has been formed in barrier layer 22. As shown in FIGS. 3A and 3B, this pillar pattern does not overlap metal layer 20, but is contained within the boundaries of metal layer 20.

Figure 4B:
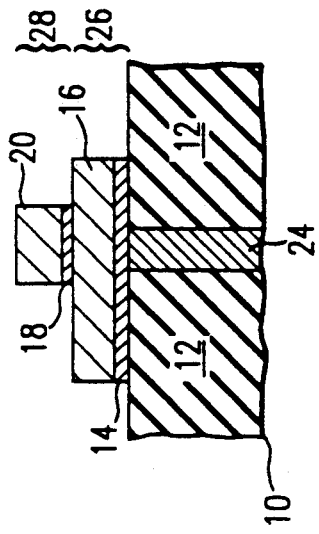
Figure 4C:
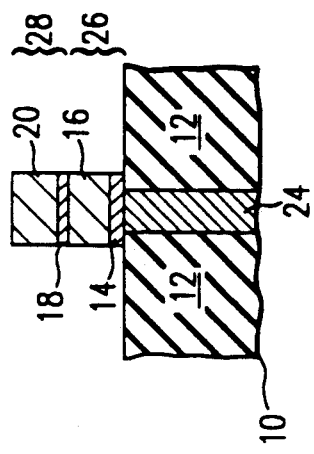

FIGS. 4A-4C illustrate the present invention after subsequent processing steps have been performed on the structure shown in FIGS. 3A-3C. Moreover, FIGURES 4A, 4B, and 4C depict the same views as are depicted by FIGS. 3A, 3B, and 3C, respectively. After the pillar pattern has been formed in barrier layer 22, photoresist layer 32 (see FIGS. 3A-3C) is stripped, and a series of etching steps are performed to produce the structure shown in FIGS. 4A-4C. The first etching step in this series removes exposed portions of metal layers 16 and 20. The preferred embodiment utilizes reactive ion etching with a dry chlorine chemistry so that the entirety of layers 16 and 20 is etched quicker than barrier layer 22. This etching step transfers the pillar pattern downward into metal layer 20 while it simultaneously transfers the lead pattern downward into metal layer 16. Barrier layers 14 and 18 serve as etch stops for the etching of layers 16 and 20, respectively.

Next, another etching step removes exposed portions of barrier layers 14, 18, and 22. Again, a reactive ion etching process using dry fluorine chemistry is used so that vertical walls result with only insignificant etching of layers 16 and 20. This etching step transfers the pillar pattern downward into barrier layer 18 so that the pillar pattern is now formed in pillar layer 28. Simultaneously, the lead pattern has been transferred downward into barrier layer 14 so that the lead pattern is now formed in lower conductive layer 26. In addition, portions of insulating layer 12 which do not underlie either of the pillar or lead patterns are exposed upon completion of this etching operation. Portions of insulating layer 12 may be removed due to overetching of the final etch process. However, no significant harm results from such a removal in these areas of device 10.

Figure 5:
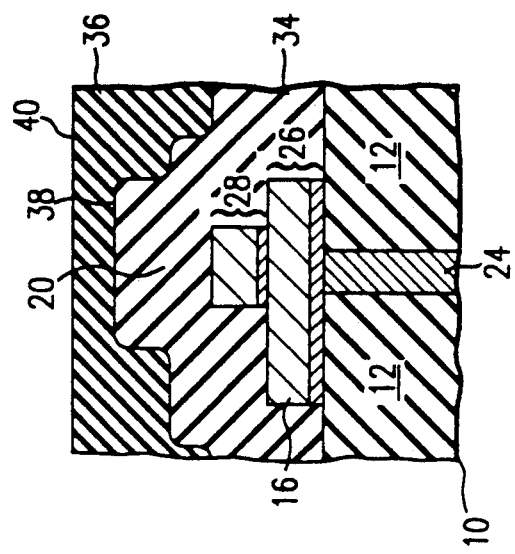
FIG. 5 shows a schematic view of the cross-section illustrated in FIGS. 1B-4B after a fourth intermediate stage in the fabrication of the pillar.

FIG. 5 shows the same cross-sectional view of device 10 as is depicted in FIG. 4B and illustrates a subsequent processing step. In FIG. 5, a layer of insulating material 34 has been applied overlying device 10 to a thickness of approximately 2.3 microns in the preferred embodiment. This thickness entirely covers pillar layer 28 and lower metal layer 26. Furthermore, the preferred embodiment utilizes a dielectric composed of plasma enhanced CVD oxide for insulating material 34. Next, a material 36, such as a photoresist, is deposited over insulating material 34 with a spin-on technique to fill valleys and uneven portions of an upper surface 38 of material 34. Material 36 is selected so that after performance of the spin-on technique a planar surface 40 results.

Figure 6:
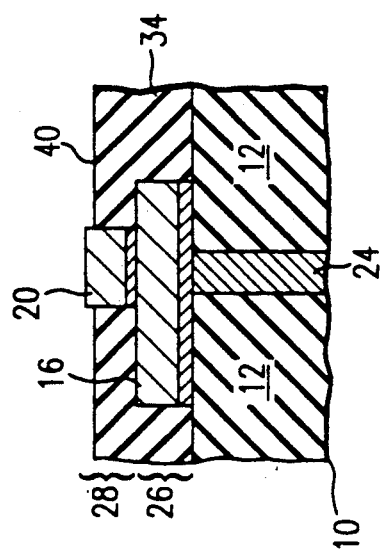
FIG. 6 shows a schematic view of the cross-section illustrated in FIG. 5 after a fifth intermediate stage in the fabrication of the pillar.

In addition, material 36 is chosen so that the etch rate of material 36 substantially equals the etch rate of material 34. Then, in an etch-back operation, surface 40 is transferred downward into layer 34 to expose a portion of layer 20, as shown in FIG. 6. The preferred embodiment utilizes a reactive ion etch with $CHF_3$ and $O_2$ or other fluorine chemistries so that layer 20 is not significantly etched. By adjusting flow rates, pressures, and power levels in a reactive ion etching system, the 1:1 etching ratio between materials 36 and 34 can be accomplished. In the preferred embodiment, approximately 1,000 angstroms of layer 20 remains exposed after this etch-back operation.

Figure 7:
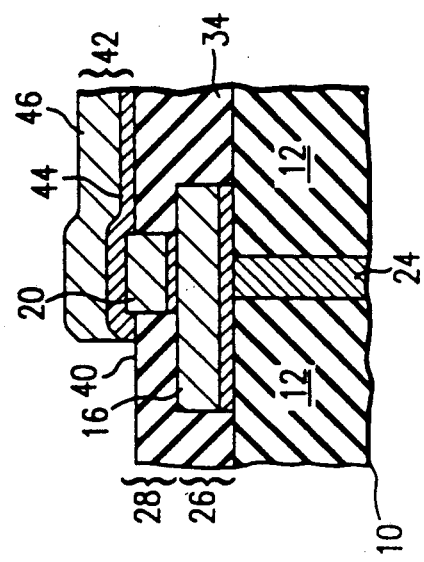
FIG. 7 shows a schematic view of the cross-section illustrated in FIG. 5 after a final stage in the fabrication of the pillar.

As shown in FIG. 7, an upper conductive layer 42, which includes a barrier layer 44 that overlies insulating material 34 and a metal layer 46 that overlies layer 44, has been deposited on planar surface 40. Subsequent patterning and etching operations define a lead in upper conductive layer 42 so that this lead vertically aligns with pillar layer 28.

In summary, the present invention provides an improved process for the formation of pillars in semiconductor devices. Specifically, the lower conductive layer lead pattern is aligned with an alignment structure on device 10, and then a pillar-pattern is aligned with the lead pattern. Consequently, worst case lateral skewing caused by manufacturing tolerances insures that all leads, pillars, and alignments structures remain within a single manufacturing tolerance limit of the structures they contact.

The foregoing description discusses a preferred embodiment of the present invention which may be changed or modified without departing from the scope of the present invention. For example, the specific metals discussed herein need not be utilized in the performance of the process of the present invention. Rather, any two diverse metal systems which, when utilized in connection with specific etch chemistries, exhibit different etch rates may be used. Moreover, the specific thicknesses discussed herein may be adjusted, and the process discussed above may be repeated at different levels in the semiconductor device. These and other modifications and changes which are obvious to those skilled in the art are intended to be included within the scope of the present invention.

What is claimed is:

1. A product formed by a method of interconnecting metal layers through an intermediate insulating layer, said method comprising the steps of:
    (a) providing a substrate having an aligning structure;
    (b) forming first and overlying pillar layers of electrically conducting material on said substrate;
    (c) forming a first layer pattern aligned with said aligning structure in said first layer and a pillar pattern aligned with said first layer pattern in said pillar layer;
    (d) depositing an insulating layer over said first and pillar layers;
    (e) removing portions of said insulating layer to expose a portion of said pillar layer; and
    (f) depositing a second layer of electrically conducting material over said pillar and insulating layers to form a second layer pattern so that said pillar layer connects said first layer to said second layer.

2. A product formed by a method of interconnecting first and second electrically conductive layers through an intermediate insulating layer, said method comprising the steps of:
    (a) providing a substrate having an aligning structure;
    (b) forming successively each of said first electrically conductive layer overlaying said substrate, an electrically conductive pillar layer overlying said first layer, and an electrically conductive barrier layer overlying said pillar layer;
    (c) removing portions of said pillar and barrier layers to define a first layer pattern aligned with said alignment structure in said pillar and barrier layers;
    (d) removing portions of said barrier layer to define a pillar pattern aligned with said first layer pattern in said barrier layer;
    (e) transferring said first layer pattern to said first layer and said pillar pattern to said pillar layer;
    (f) forming an electrically insulating layer overlying said first layer; and (g) forming a second electrically conductive layer overlying said electrically insulating and pillar layers.

3. A product formed by a method of forming a pillar in a semiconductor device having an alignment structure thereon, a first barrier layer overlying said alignment structure, a bottom conductive layer overlying said first barrier layer, a second barrier layer overlying said bottom conductive layer, a top conductive layer overlying said second barrier layer, and a third barrier layer overlying said top conductive layer, said method comprising the steps of:

(a) providing a semiconductor structure having an alignment structure thereon, a first barrier layer overlying said alignment structure, a bottom electrically conductive layer overlying said first barrier layer, a second barrier layer overlying said bottom electrically conductive layer, a top electrically conductive layer overlying said second barrier layer, and a third barrier layer overlying said top electrically conductive layer;

(b) defining a lead pattern in said third barrier layer laterally positioned within a predetermined tolerance of said alignment structure, said top electrically conductive layer, and said second barrier layer;

(c) defining a pillar pattern in said third barrier layer laterally positioned within said predetermined tolerance of said lead pattern;

(d) simultaneously etching portions of said top and bottom electrically conductive layers using an etchant which etches selectively to said electrically conductive layers relative to said barrier layers; and (e) simultaneously etching portions of said first, second, and third barrier layers using said top and bottom electrically conductive layers as etch stops.

* * * * *